United States Patent
Yang et al.

(10) Patent No.: US 9,542,312 B2
(45) Date of Patent: *Jan. 10, 2017

(54) SELECTIVELY PROGRAMMING DATA IN MULTI-LEVEL CELL MEMORY

(71) Applicant: MARVELL WORLD TRADE LTD., St. Michael (BB)

(72) Inventors: Xueshi Yang, Cupertino, CA (US); Tony Yoon, Los Altos, CA (US)

(73) Assignee: MARVELL WORLD TRADE LTD. (BB)

( * ) Notice: Subject to any disclaimer, the term of this patent is extended or adjusted under 35 U.S.C. 154(b) by 92 days.

This patent is subject to a terminal disclaimer.

(21) Appl. No.: 14/257,248

(22) Filed: Apr. 21, 2014

(65) Prior Publication Data

US 2014/0229663 A1    Aug. 14, 2014

Related U.S. Application Data

(63) Continuation of application No. 12/493,349, filed on Jun. 29, 2009, now Pat. No. 8,706,951.

(60) Provisional application No. 61/082,135, filed on Jul. 18, 2008.

(51) Int. Cl.
| | |
|---|---|
| *G06F 12/00* | (2006.01) |
| *G06F 13/00* | (2006.01) |
| *G06F 13/28* | (2006.01) |
| *G06F 12/02* | (2006.01) |
| *G06F 13/42* | (2006.01) |
| *G11C 11/56* | (2006.01) |

(52) U.S. Cl.
CPC ....... *G06F 12/0246* (2013.01); *G06F 13/4239* (2013.01); *G06F 2212/7202* (2013.01); *G06F 2212/7208* (2013.01); *G11C 11/5628* (2013.01); *G11C 2211/5641* (2013.01)

(58) Field of Classification Search
None
See application file for complete search history.

(56) References Cited

U.S. PATENT DOCUMENTS

| | | | |
|---|---|---|---|
| 5,778,413 A | 7/1998 | Stevens et al. | |
| 5,930,167 A * | 7/1999 | Lee | G06F 12/0246 365/185.03 |
| 6,336,174 B1 | 1/2002 | Li et al. | |
| 6,711,710 B2 | 3/2004 | Jiang et al. | |
| 7,061,798 B2 | 6/2006 | Chen et al. | |
| 7,096,137 B2 | 8/2006 | Shipton et al. | |
| 7,278,034 B2 | 10/2007 | Shipton | |
| 7,301,805 B2 | 11/2007 | Gorobets et al. | |
| 7,463,985 B2 | 12/2008 | Cox | |

(Continued)

*Primary Examiner* — Jared Rutz
*Assistant Examiner* — Marwan Ayash

(57) ABSTRACT

Devices, systems, methods, and other embodiments associated with accessing memory are described. In one embodiment, a method detects that a power quality associated with a volatile memory in a computing device meets a threshold value and in response thereto, reprogramming data from the volatile memory to a flash memory comprising multi-level cells. The reprogramming comprises: copying the data from the volatile memory, and writing the copied data: (1) to the most significant bits of the multi-level cells in the flash memory while skipping the least significant bits of the multi-level cells, or (2) to the least significant bits of the multi-level cells while skipping the most significant bits.

15 Claims, 11 Drawing Sheets

(56) References Cited

U.S. PATENT DOCUMENTS

| | | |
|---|---|---|
| 7,522,451 B2 | 4/2009 | Chen |
| 7,577,880 B2 | 8/2009 | Hazama |
| 7,744,387 B2 | 6/2010 | Yu et al. |
| 7,966,462 B2 * | 6/2011 | Lee .................... G06F 12/0246 711/103 |
| 8,331,187 B2 * | 12/2012 | Houston ............... G11C 11/413 365/154 |
| 2007/0006013 A1 * | 1/2007 | Moshayedi ......... G06F 11/1441 714/2 |
| 2007/0016756 A1 | 1/2007 | Hsieh et al. |
| 2007/0022309 A1 | 1/2007 | Adamo et al. |
| 2007/0168769 A1 | 7/2007 | Hazama |
| 2007/0268745 A1 * | 11/2007 | Lasser ................ G11C 11/5628 365/185.01 |
| 2008/0010400 A1 | 1/2008 | Moon |
| 2008/0019068 A1 | 1/2008 | Reynolds et al. |
| 2008/0141100 A1 * | 6/2008 | Kang .................. G11C 11/5621 714/773 |
| 2008/0165579 A1 | 7/2008 | Lee |
| 2008/0215801 A1 | 9/2008 | Tan et al. |
| 2008/0316815 A1 | 12/2008 | Lin |
| 2009/0248952 A1 | 10/2009 | Radke et al. |
| 2010/0017561 A1 | 1/2010 | Yang et al. |
| 2011/0125954 A1 | 5/2011 | Yeh et al. |
| 2012/0166706 A1 | 6/2012 | Pua et al. |
| 2012/0198131 A1 | 8/2012 | Tan et al. |
| 2012/0272123 A1 | 10/2012 | Yeh |
| 2013/0007340 A1 | 1/2013 | Kim et al. |

* cited by examiner

SELECTIVELY PROGRAMMING DATA IN MULTI-LEVEL CELL MEMORY

CROSS REFERENCE TO RELATED APPLICATIONS

This disclosure is a continuation of U.S. application Ser. No. 12/493,349 filed on Jun. 29, 2009, now U.S. Pat. No. 8,706,951 which claims benefit under 35 USC §119(e) to U.S. provisional application Ser. No. 61/082,135, filed on Jul. 18, 2008, which are both hereby wholly incorporated by reference.

BACKGROUND

Digital data is often stored to and retrieved from memory. Typically, memory is manufactured using chips of silicon. Semiconductor materials etched onto the silicon allow many transistors to be implemented in a chip to produce high density memories. The transistors can be configured to form NAND gates, inverters, and other functions used to implement the memory.

Storing two or more bits in a memory cell increases the density of data that can be stored in the memory cell. The access and write times of a cell of data, however, may become non-uniform. For example, in the case of 2 bits/cell with 11, 10, 00, 01 represented by the 4 states of the memory cell respectively, the most significant bit (MSB) of a memory cell may be accessed faster than the least significant bit (LSB). This is because only one compare is needed to determine if the MSB is above a middle threshold value. A second compare is needed to determine if the LSB is above a lower threshold (when the MSB is below the middle threshold) or above a higher threshold (when the MSB is higher than the middle threshold).

Flash memory is often designed with a line (a.k.a. wordline) structure where all the cells connected to the wordline are accessed (read and program) at the same time. In the case of Multiple Level Cell (MLC) memory cells, the MSB bits of all the cells in the wordline form a first data page and the LSB bits form a second data page. The two data pages will have different access times because the MSBs and the LSBs have different access times. The access time for a particular memory access thus becomes a variable when there is more than one possible access time. It may be unacceptable in some applications to have a variable memory access time. A better way to access memory may be desirable.

SUMMARY

In one embodiment, a computer-implemented method comprises detecting that a power quality associated with a volatile memory in a computing device meets a threshold value and in response thereto, reprogramming data from the volatile memory to a flash memory. The flash memory is configured with multi-level cells (MLC) and where the multi-level cells are configured to store at least two bits per cell. Most significant bits from the multi-level cells are grouped to define fast access pages and least significant bits are grouped to define slow access pages. The reprogramming comprises: copying, by at least hardware of the computing device, the data from the volatile memory; and writing the copied data: (1) to the most significant bits of the multi-level cells in the flash memory while skipping the least significant bits of the multi-level cells, or (2) to the least significant bits of the multi-level cells while skipping the most significant bits.

In another embodiment, an apparatus is disclosed that comprises flash determination logic, implemented in at least hardware, to identify N access speeds available for accessing a multi-level memory cell device (MLMCD) comprising multi-level cells. The multi-level cells are configured to store at least two bits per cell wherein most significant bits are grouped to define fast access pages and least significant bits are grouped to define slow access pages. Flash control logic, implemented in at least hardware, is configured to access the MLMCD upon receiving a memory command that is directed to a single type of memory, wherein the MLMCD is to be accessed using one speed of the N access speeds, and where the one speed of the N access speeds is selected based on at least one parameter in the memory command. The flash control logic is configured to access the MLMCD with the one speed by accessing a group of most significant bits from the MLMCD without accessing a group of least significant bits from the MLMCD. In response to an event, the flash control logic is further configured to program data from a volatile memory to the fast access pages by programming the data into a group of most significant bits while skipping the least significant bits.

In another embodiment, an apparatus is disclosed that comprises flash determination logic to identify N access speeds available for accessing a multi-level memory cell device (MLMCD). Flash control logic functions to access the MLMCD upon receiving a memory command. The MLMCD is accessed using one speed of the N access speeds and where the one speed is selected based on at least one parameter in the memory command.

In another embodiment, an apparatus is disclosed that comprises a flash memory comprising multi-level cells (MLC), wherein the multi-level cells include most significant bits grouped together to form fast access pages and least significant bits grouped together to form slow access pages, wherein the fast access pages are configured to be programmed faster than the slow access pages. Program logic is implemented in at least hardware configured to program data from a volatile memory to the most significant bits upon detecting that a power quality associated with the volatile memory meets a threshold value. The program logic is further configured to detect a fast access bit that is part of a bit field in a memory request wherein the fast access bit indicates to program the data from the volatile memory to pages in the flash memory formed by a group of most significant bits. The program logic is further configured, in response to detecting the fast access bit, to program the data from the volatile memory to pages formed from a group of most significant bits from the multi-level cells while skipping pages formed from the group of least significant bits.

In one system embodiment, a system is disclosed that interfaces with a flash memory that has fast access pages and slow access pages of memory. The fast access pages are configured to be accessed faster than the slow access pages. In some circumstances, the system detects that power may soon be lost. In response to the detection of possible loss of power, the system moves/copies data stored in a volatile memory and controls the data to be written into the fast access pages of the flash memory but not to the slow access pages. Using the fast access pages rather than the slow access pages provides a better chance that the volatile data is backed up before a power failure.

In another embodiment, the system is disclosed that responds to memory requests. For example, the system may receive memory requests from an application that requests data be stored in the fast access pages. For example, streaming video data is received and is requested to be stored upon reception. The streaming video data is stored in the fast access memory. The system can later transfer the video data to slow access pages for later post-processing and video decompression if desired.

In yet another embodiment, a system is disclosed that is configured to execute a power critical application. The system may receive an indication from the power critical application that the system is to operate in a lower power mode. Upon receiving the indication, the system is configured to begin favoring the use of the slow access pages rather than the fast access pages. Thus the system modifies the control of data storage to use the slow access pages and avoid or at least reduce the use of the fast access pages.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1A:
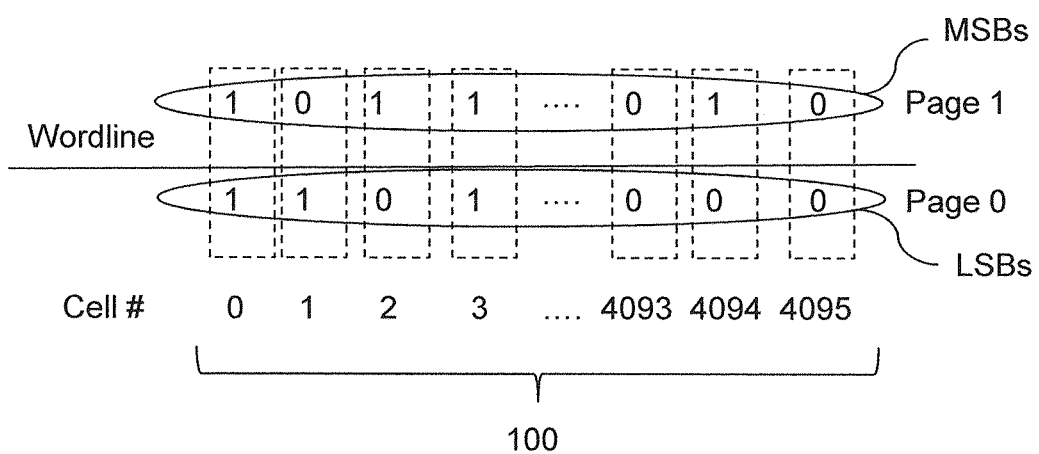
FIGS. 1A illustrates one embodiment of a memory map associated with selectively accessing memory.

Described herein are example systems, methods, and other embodiments associated with controlling and selectively accessing memory.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an application specific integrated circuit (ASIC), a programmable logic device, a compact disk (CD), other optical medium, a random access memory (RAM), a read only memory (ROM), a memory chip or card, a memory stick, and other media from which a computer, a processor or other electronic device can read.

"Logic", as used herein, includes but is not limited to hardware, firmware, software stored or in execution on a machine, and/or combinations of each to perform a function(s) or an action(s), and/or to cause a function or action from another logic, method, and/or system. Logic may include a software controlled microprocessor programmed with an algorithm, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

"Memory access", as used herein, includes but is not limited to writing, reading, content addressable memory (CAM) matching, and programming a memory cell or a group of memory locations. Memory access may include dual reads to the same memory using two read ports. Memory access includes other types of interactions with memory as would be appreciated by those of ordinary skill in the art.

FIG. 1A illustrates one embodiment of a memory map 100 associated with selectively scheduling memory accesses in parallel. In one embodiment, the memory map 100 is for a memory device that is implemented with multiple level memory cell devices (MLMCDs). FIG. 1A shows an MLMCD with an array of 4096 MLCs (e.g. cell numbers 0 to 4095) that store values as most significant bits (MSBs) and least significant bits (LSBs). Groups of LSBs of different MLMCDs are combined to form a first page (page 0) of memory. The MSBs are combined to form a second page (page 1) of memory. In one example, an MLMCD stores both the LSB and the MSB bits as charge levels in floating gate transistors. In other embodiments, the multi-level cell is configured to store more than 2 bits per cell, for example, a triple level cell that stores three (3) bits per cell, a quad level cell that stores four (4) bits per cell, or other number of levels. The multi-level cells are configured to store at least two bits per cell where bits from different cells may be grouped to define fast access pages and slow access pages (e.g., grouping most significant bits and grouping least significant bits).

Figure 1B:
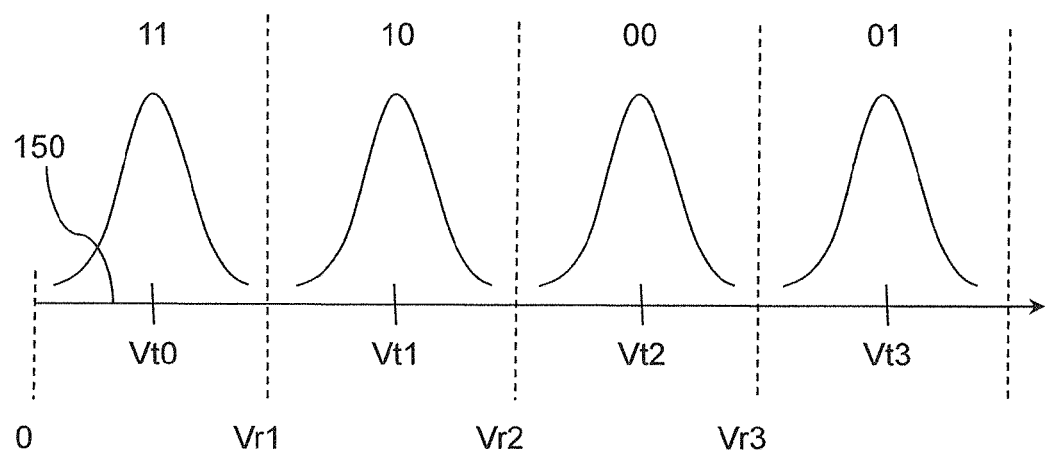
FIG. 1B illustrates an example graph with example charge levels that may be in floating gate transistors.

With reference to FIG. 1B, an example graph is illustrated with a range of values that a two bit MLC threshold voltage may represent. The example graph shows example charge levels that may be in the floating gate transistors. $V_r$ values represent voltage reference values and $V_t$ values represent voltage thresholds. 11, 10, 00, and 01 represent the bit values that correspond to a particular voltage threshold $V_r$. Reading the LSB may take longer than reading the MSB. For example, when reading the LSB or the MSB, a voltage comparison is made to determine if the threshold voltage ($V_t$) shown along line 150 is above or below a medium voltage threshold. The MSB is high when $V_t$ is above the $V_{r2}$, otherwise the MSB is low. The MSB is known after one comparison. However, an additional comparison is performed to determine the LSB. The additional comparison causes the access time of the LSB to be longer. The LSB is low when the MSB is low and a second voltage comparison between $V_t$ and $V_{r1}$ determines that the threshold $V_t$ voltage is below a second voltage threshold $V_{r1}$. The LSB is high when the MSB is high and the second voltage comparison determines that $V_t$ is above the second voltage threshold $V_{r2}$. The LSB page 0 of FIG. 1A will be longer than the access time of page 1.

Figure 2:
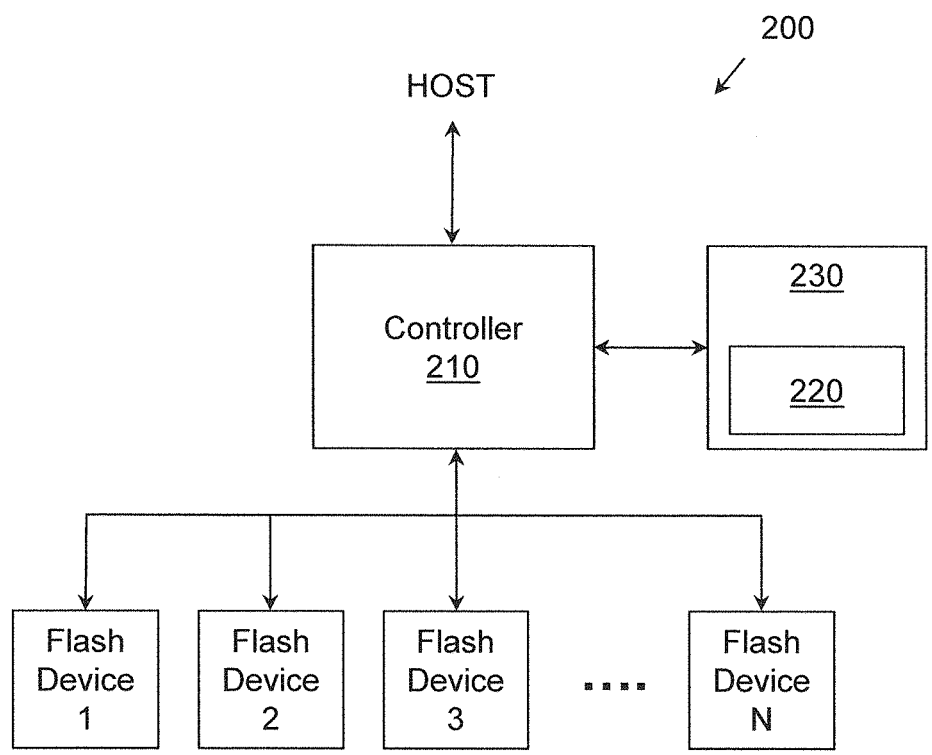
FIG. 2 illustrates an embodiment of a memory system associated with selectively accessing memory.

FIG. 2 illustrates one embodiment of a system 200 associated with controlling and accessing memory. The system 200 comprises a controller 210 for scheduling a page request to the flash devices 1-N. In one example, the flash devices 1-N complete the page access before the controller 210 issues a new page request to the flash devices 1-N. The controller 210 is configured to schedule page accesses to be completed, at least partially in parallel, by two or more of the flash devices 1-N.

In one embodiment, the system 200 interfaces with flash devices 1-N that have fast access pages and slow access pages of memory. The fast access pages are accessed faster than the slow access pages as previously described. In the event that the system 200 detects that the system 200 may soon lose power, the controller 210 initiates and controls movement of volatile data 220 stored in a volatile memory 230 into the fast access pages of the flash devices 1-N but not the slow access pages. Using the fast access pages rather than the slow access pages provides a higher probability that the volatile data 220 is backed up before a sudden power failure.

In another embodiment, the system 200 may receive memory requests from an application that requests that received data be stored in the fast access pages. For example, streaming video data can be requested to be stored upon reception (e.g. with little time delay). The controller 210 stores the streaming video data in the fast access memory of the flash devices 1-N to accommodate the real time stream. The system 200 can later transfer the video data to slow access pages for later post-processing and video decompression when timing is no longer urgent. This may also include reprogramming the flash memory with the data to use both fast and slow pages so that pages are not skipped. In this manner, memory capacity is more fully utilized.

In another embodiment, the system 200 is configured to execute a power critical application. Suppose the controller 210 receives a critical power indication from the power critical application. The critical power indication indicates that the system 200 is to operate in a lower power mode. In response, the system 200 modifies control of memory usage to favor using the slow access pages rather than the fast access pages to conserve power. For example, slower access pages use less power than fast access pages because the memory cell bit lines are not driven as fast and are driven with less power.

Thus in general, the system 200 functions to detect an indication indicative of whether to program fast access pages or slow access pages of flash memory. The indication may represent one of the conditions described above or other condition that would warrant using fast or slow pages. The system 200 then programs the data, in response to the detecting, from a volatile memory: (1) to the fast access pages of the multi-level cell (MLC) flash memory while skipping (e.g. does not program to) the slow access pages, or (2) programs to the slow access pages while skipping the fast access pages.

Figure 3:
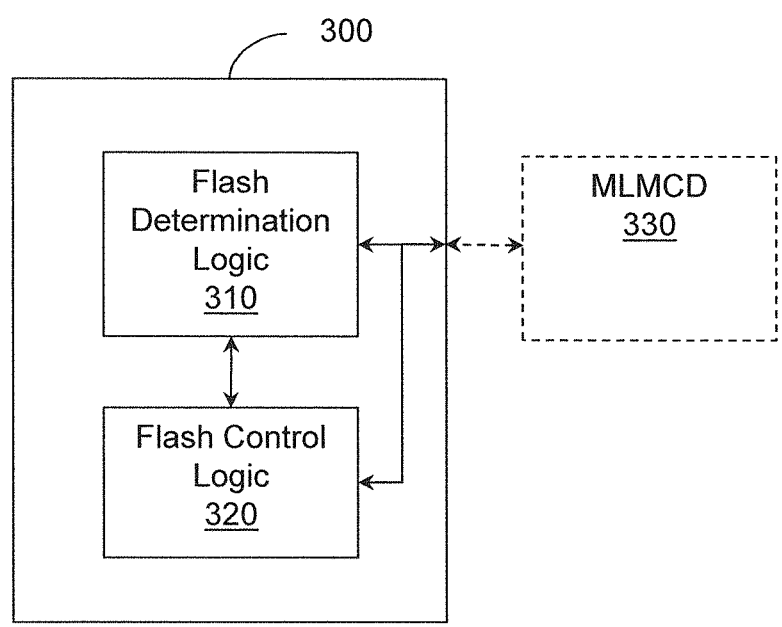
FIG. 3 illustrates an embodiment of an apparatus associated with selectively accessing memory.

FIG. 3 illustrates one embodiment of an apparatus 300 associated with selectively accessing memory. In one embodiment, the apparatus 300 is implemented to access pages of flash memory in flash memory chips. In another embodiment, the apparatus 300 implements a memory controller in a chip. The memory controller controls and selectively access pages of memory (e.g. fast access pages of memory and slow access pages of memory as previously described). Memory accesses are issued by the controller to the fast access pages or to the slow access pages based, at least partially, on a determined access speed. Processes for determining the access speed are discussed below.

In one embodiment, the apparatus 300 is implemented with flash determination logic 310 and flash control logic 320. A multi-level memory cell device (MLMCD) 330 external to the apparatus 300 is connected to the apparatus 300. The MLMCD 330 may be a flash memory. In another embodiment, the MLMCD 330 may be included in the apparatus 300. It will be appreciated that the MLMCD 330 can be different types of memory devices such as a random access memory (RAM), solid state memory, and so on.

The MLMCD 330 is comprised of multi-level cells (MLCs). A single MLC stores two bits. In other embodiments, the MLC can be implemented to store a different number of bits. For example, the MLC may be a Triple Level Cell (TLC) that stores three (3) bits per cell, a Quad Level Cell (QLC) that stores four (4) bits per cell, or a greater number of bits. The bit values are represented by threshold voltage levels in a cell as discussed above with reference to FIG. 1A. Of course, other means of storage may be used that result in having faster and slower access pages.

In one embodiment, the flash determination logic 310 identifies speeds at which the MLMCD 330 can be accessed. There may be N access speeds available for accessing the MLMCD 330. In one embodiment, the N access speeds correspond to integer numbers of clock cycles. There are different access speeds because the MLMCD 330 contains fast access pages and slow access pages. Fast access pages correspond to the MSBs of MLCs and slow access pages correspond to the LSBs of MLCs in the case of 2 bits/cell. The MSB pages are accessed faster than the LSB pages as discussed above with reference to FIG. 1A. For some devices, the LSB pages may be accessed faster than MSB pages.

The value of N equals two when the MLMCD 330 has fast access pages and slow access pages. The value of N may be greater than two when the MLMCD 330 has memory pages with more than one access rate. For example, N equals four when the MLMCD 330 has different program and read times. The four access speeds are a fast program speed, a slow program speed, a fast read speed, and a slow read speed. Programming the MLMCD 330 or a flash device is similar to writing a traditional RAM memory location.

TABLE 1

| | Page | | | | | | | | |
|---|---|---|---|---|---|---|---|---|---|
| | 0 | 1 | 2 | 3 | 4 | 5 | 6 | 7 | ... |
| Program Time | 200 us | 200 us | 800 us | 800 us | 200 us | 200 us | 800 us | 800 us | |
| Read Time | 20 us | 20 us | 40 us | 40 us | 20 us | 20 us | 40 us | 40 us | |

In one embodiment, the N access speeds are a function of MLMCD 330 page addresses (or memory pages) of the MLMCD 330. Table 1 shows exemplary access times for one example MLMCD 330. In this example, a period of the addresses is four because the access times repeat every four pages. The program time for pages 0 and 1 is 200 microseconds and for pages 2 and 3 the program time is 800 microseconds. This pattern of program times repeats every four pages with a period of four. The read time for pages 0 and 1 is 20 microseconds and for pages 2 and 3 the read time is 40 microseconds. This pattern of read times alsorepeats every four pages with a period of four. Those of ordinary skill in the art will realize that other patterns of read times and programs times are possible and the access times may repeat at intervals other than at four page intervals.

In one embodiment, the flash control logic 320 accesses the MLMCD 330 upon receiving a memory command and accesses one or more pages of the MLMCD 330. The MLMCD 330 is accessed using one of the determined N access speeds. The access speed used to access the MLMCD 330 is a function of parameters in the memory command. As discussed above, the access speed may be a function of the memory address to be accessed and the type of MLMCD 330 memory access. Access types for the MLMCD 330 can include programming, reading or erasing a memory location.

In one embodiment, the MLMCD 330 is implemented with blocks of memory that can be accessed in parallel. In this configuration, the flash control logic 320 queues received memory commands for possible parallel execution. For example, suppose the flash control logic 320 receives two memory commands (e.g. a first memory command and a second memory command). The flash controller logic 320 controls the commands to schedule the first memory command and the second memory command to access different pages of the MLMCD 330, at least partially, in parallel.

In one embodiment, the N access speeds are used to form a slow group of access speeds and a fast group of access speeds. The slow group accesses the MLMCD 330 slower than the fast group. How the flash control logic 320 performs accesses to the memory can depend on certain detected conditions. For example, the flash control logic 320 is configured to access the MLMCD 330 with the slow group of access speeds when the flash control logic 320 receives a critical power indication signal from an application software. Suppose as an example that a software application is performing a decryption operation using several microprocessors on a chip that includes the apparatus 300. The microprocessors execute math intensive decryption algorithms and thus may heat up the chip. To reduce the chip heat, the application software can provide a critical power indication to the flash control logic 320. In response, the flash control logic 320 uses the slow access pages while the critical power indication is asserted. Slow access pages use less power than fast access pages because the memory cell bit lines are not driven as fast and are driven with less power.

In one embodiment, the flash determination logic 310 calculates arithmetic modulo results of the addresses of the MLMCD 330. The arithmetic modulo results indicate which addresses map to fast access pages and which addresses map to slow access pages. For example, addresses with an arithmetic modulo result of 0 or 1 may correspond to fast access pages and addresses with an arithmetic modulo result of 2 or 3 may correspond to slow access pages. As discussed above, the access times may also depend on the type of memory operation. For example, a programming memory operation may have a slower access time than a read memory operation for the same address.

In one embodiment, the flash determination logic 310 performs an arithmetic modulo calculation based, at least in part, on a period of MLMCD 330 addresses to produce a modulo result. The N access speeds are periodic based on addresses of the MLMCD 330. The access speed used by the flash control logic 320 to access the MLMCD 330 is a function of the modulo result.

In one embodiment, the flash determination logic 310 determines whether a memory access address is mapped to a fast access page or a slow access page. The determination is based, at least partially, on either a hash function or a table lookup. The mapping of addresses to the fast access pages and the slow access pages is deterministic. For example, the hash function may be a one-to-one mapping function that maps addresses to fast and slow pages. The hash function may determine the number of clock cycles needed to complete a memory access on a per address basis.

Figure 4:
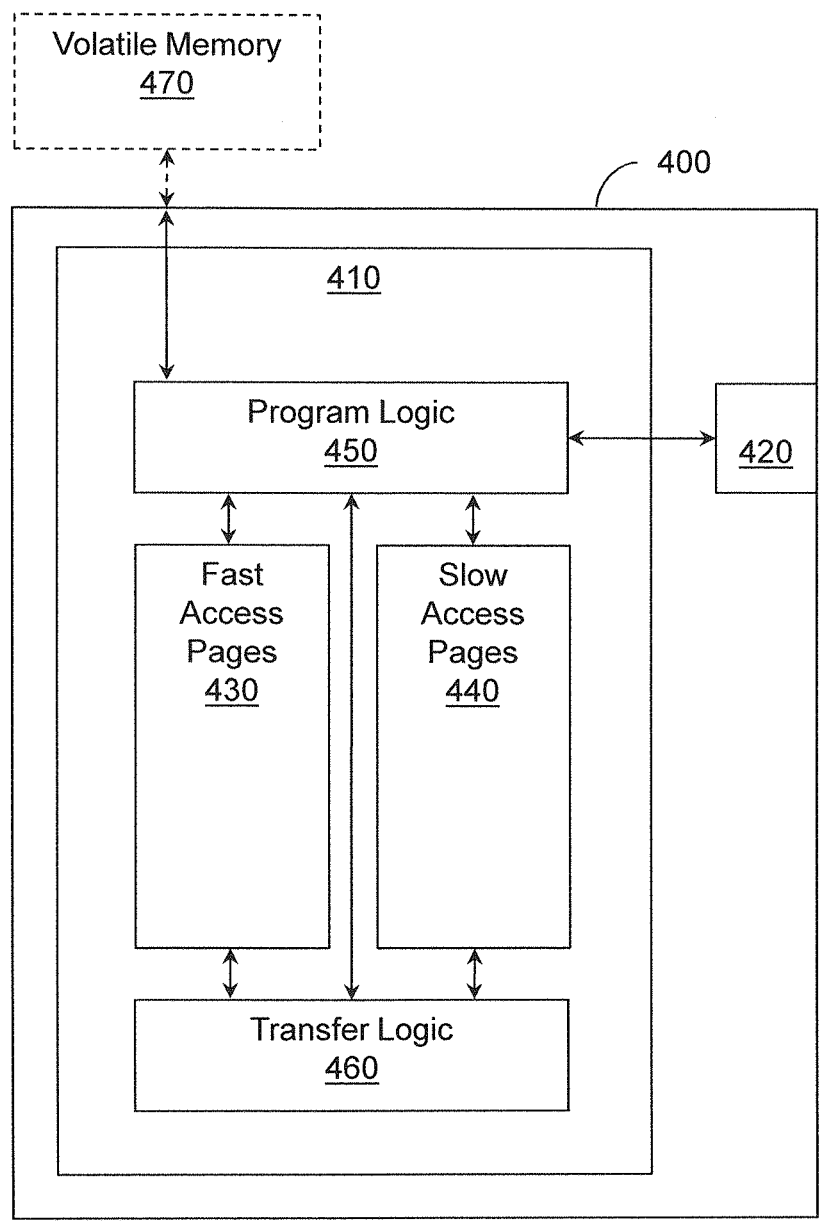
FIG. 4 illustrates another embodiment of an apparatus associated with selectively accessing memory.

FIG. 4 illustrates another embodiment of an apparatus 400 associated with selectively accessing memory. The apparatus 400 may be implemented in a chip that contains solid state flash memory. A chip is a set of micro-miniaturized electronic circuits fabricated on semiconductor material.

In one embodiment, the apparatus 400 is implemented with an MLC flash memory 410 and a power indication input 420. The flash memory 410 is implemented with fast access pages 430 and slow access pages 440 of memory. The fast access pages 430 are programmed faster than the slow access pages 440. The fast access pages 430 and the slow access pages 440 may be accessed, at least partially, in parallel. Similarly, different fast access pages 430 may be accessed, at least partially, in parallel. The MLC flash memory 410 may be implemented with multi-level cell NAND flash memory devices. A data path of the flash memory 410 is controlled with program logic 450 and transfer logic 460.

In one embodiment, the power indication input 420 receives a signal indicating a power level that the MLC flash memory 410 is to operate below. An application may be running several microprocessors in the apparatus 400 simultaneously. Several processors toggling many circuits will generate significant heat. To lower the heat, the application will provide a critical power indication signal to the power indication input 420. The program logic 450 is implemented to detect the critical power indication signal. In response to this signal, program data that is received by the flash memory 410 is stored in the slow access pages 440.

In one embodiment, the program logic 450 programs data from an external volatile memory 470 to the fast access pages 430 upon detecting that a power quality associated with the volatile memory 470 at least meets a threshold value. This condition can be set to indicate a possible power failure. In another embodiment, the volatile memory 470 is on the same chip as the flash memory 410. The threshold level may be a current level, a voltage level, and/or a wattage level.

It will be appreciated that the program logic 450 can be configured to detect that the power quality has met the threshold value in a variety of ways. For example, the program logic 450 may be implemented with sensor to monitor a current level, a voltage level, and/or a wattage level of the apparatus 400. As used herein, a threshold level is met when the value of one of these levels meets (e.g. equals) or exceeds the set threshold value. Alternatively, the program logic 450 can calculate a root mean square (RMS) value of one or more of the current, voltage and wattage levels. The program logic 450 programs data from the external volatile memory 470 to the fast access pages 430 when one or more of the RMS values meets a threshold. The action of programming data can include moving/writing the data, or copying and writing the data. In other embodiments, peak currents and voltages, power factors, current and voltage sags and swells, harmonic distortion, and so on may be used by the program logic 450 to detect that the power quality associated with the volatile memory 470 meets a threshold value (e.g. meets or exceeds the threshold).

The transfer logic 460 can also selectively program data residing in the fast access pages 430 to available slow access pages 440. The data is programmed into slow access pages 440 upon determining that the program logic 450 is idle. For example, the apparatus 400 may be receiving streaming video data that should be stored quickly into memory. By storing the data to fast memory locations, the apparatus 400 has enough throughput to keep up with receiving the streaming video data. The transfer logic 460 moves the part of the streaming video data into slow access pages 440 when the speed of memory access is not critical. The streaming video data may be decompressed and post-processed from the slow access pages when the speed of memory access is not critical.

In one embodiment, the MLC flash memory 410 is implemented with flash silicon dies. The flash silicon dies are implemented with blocks of memory. The blocks of memory are implemented with at least one of the fast access pages 430 and at least one of the slow access pages 440.

Figure 5:
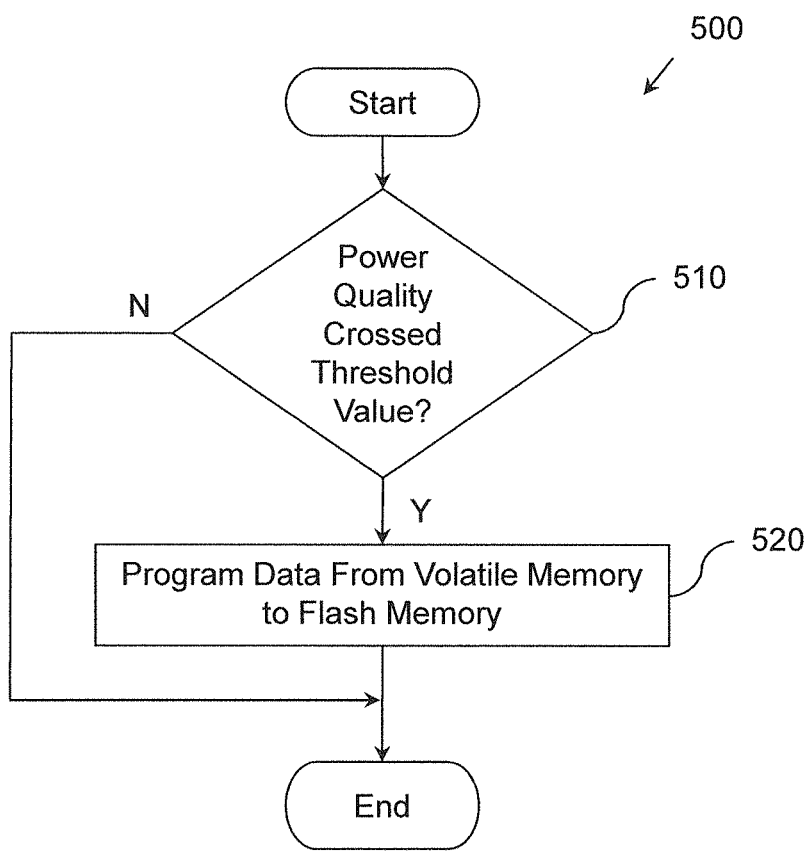
FIG. 5 illustrates one embodiment of a method associated with selectively accessing memory.

FIG. 5 illustrates an embodiment of a method 500 associated with selectively accessing memory. The method 500 improves the accessing of memory storage systems by allowing time critical memory applications to access fast access pages of memory without accessing slow access pages of memory.

In one embodiment, the method 500 detects, at 510, whether a condition exists that causes the use of fast or slow access pages. For example, an indication indicative of whether to program fast access pages or slow access pages of a multi-level cell (MLC) flash memory is detected. Then in response to the detected indication, data is programmed from a volatile memory: (1) to the fast access pages of the multi-level cell (MLC) flash memory while skipping the slow access pages, or (2) to the slow access pages while skipping the fast access pages.

In one embodiment, the condition/indication detected is a power quality associated with the volatile memory meeting a threshold value. The detection can be performed similar to how the apparatus 400 of FIG. 4 detected a power quality meeting a threshold level. For example, selected conditions/values can be monitored (e.g. a current level, a voltage level, and/or a wattage level). One or more values from the monitored condition(s) is compared to the threshold value to determine if the threshold value is met. Alternatively, the method 500 may calculate a root means squared (RMS) value of one or more of the current, voltage and/or wattage values. The method 500 determines that the threshold level is met, at 510, when one or more of the RMS values meets the threshold. In other embodiments, peak currents and voltages, power factors, current and voltage sags and swells, harmonic distortion, and so on may be used to detect, at 510, that a power quality associated with the volatile memory has met a threshold value.

When the threshold level is met, the method 500 programs data from a volatile memory to a multi-level cell (MLC) flash memory, at 520. Meeting the threshold level may mean that there is a high risk of a power failure in the volatile memory that could result in the loss of data. To transfer as much data as possible from the volatile memory to the flash memory before a possible power failure occurs, the data is programmed to the fast access pages, at 520. The data may be programmed into slow access pages when the threshold value has not been met or when the threat of power failure diminishes.

In one embodiment, the data is programmed, at 520, into at least two different fast access pages. The data can be programmed at least partially in parallel. In one embodiment, programming data from a volatile memory to the MLC flash memory, at 520, is performed so that the data is programmed to fast access pages in a sequential order of increasing fast access page addresses. The slow access pages are skipped when the data is programmed to the fast access pages. In another embodiment, the data is programmed from a volatile memory to the MLC flash memory, at 520, in a fast access page order with increasing fast access page addresses.

Figure 6:
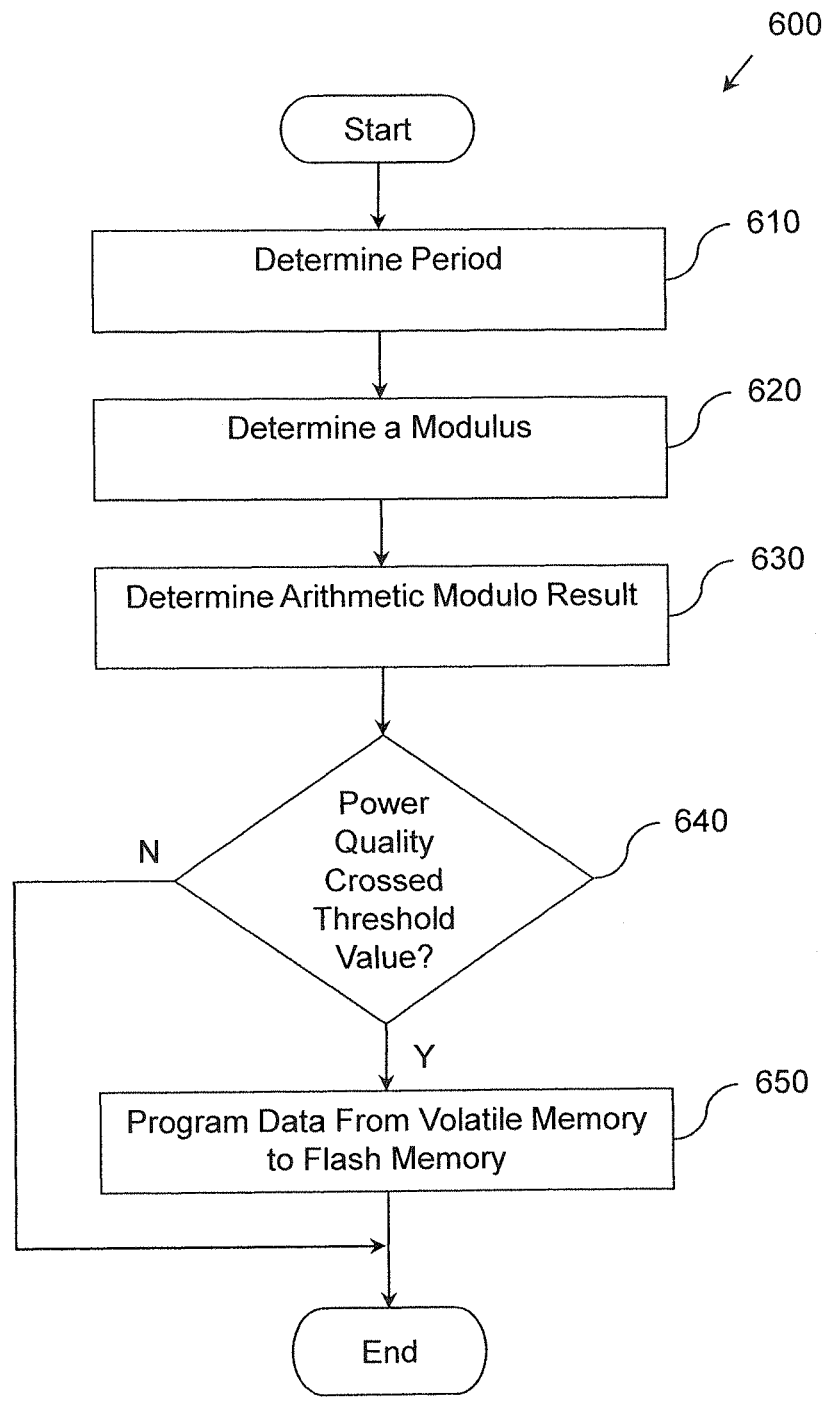
FIG. 6 illustrates another embodiment of a method associated with selectively accessing memory.

FIG. 6 illustrates another embodiment of a method 600 associated with controlling and selectively accessing memory. The method 600 improves the accessing of memory storage systems by allowing time critical memory applications to program fast access pages of memory instead of programming slow access pages of memory. The method 600 will be described as selectively accesses memory in flash memory.

In one embodiment, the method 600 begins by determining a period at 610. The period is based on access speeds of a sequential string of memory pages as discussed above with reference to FIG. 3. For example, the period of the addresses shown in Table 1 is four. As discussed below, volatile memory data may be programmed into the fast access page, at 650, as discussed below, as a function of the period when a power quality associated with the volatile memory meets a threshold value.

At block 620, the method determines a modulus. The modulus corresponds to addresses of memory pages. For example, the addresses shown in Table 1 for a flash memory have memory access times that repeat at intervals of four sequential addresses. Therefore, the modulus is determined as four. The programming of data from the volatile memory to the MLC flash memory, at 650, as discussed below, is a function of the modulus.

In one embodiment, the method determines an arithmetic modulo result at 630. The arithmetic modulo result is the result of an arithmetic calculation using the modulo determined at 620 and therefore is based on the modulus. The arithmetic modulo result is associated with addresses of the fast access pages and the slow access pages. The modulus is based in part on the period. The data may be programmed into the fast access pages, at 650, as discussed below, as a function of the arithmetic modulo result.

In one embodiment, the method 600 detects whether a power quality associated with a volatile memory meets a threshold value at 640. A value that meets the threshold level may indicate that there is a high risk of a power failure in the volatile memory. The detecting operation at 640 may be performed similar to how the apparatus 400 of FIG. 4 detected a power quality meeting a threshold level.

The method 600 programs data from a volatile memory to an MLC flash memory, at 650, when the threshold level is met. To assure that as much data as possible is transferred from the volatile memory to the flash memory before a possible power failure occurs, the method 600 writes the data from a volatile memory to fast access pages and avoids writing the data to the slow access pages.

Figure 7:
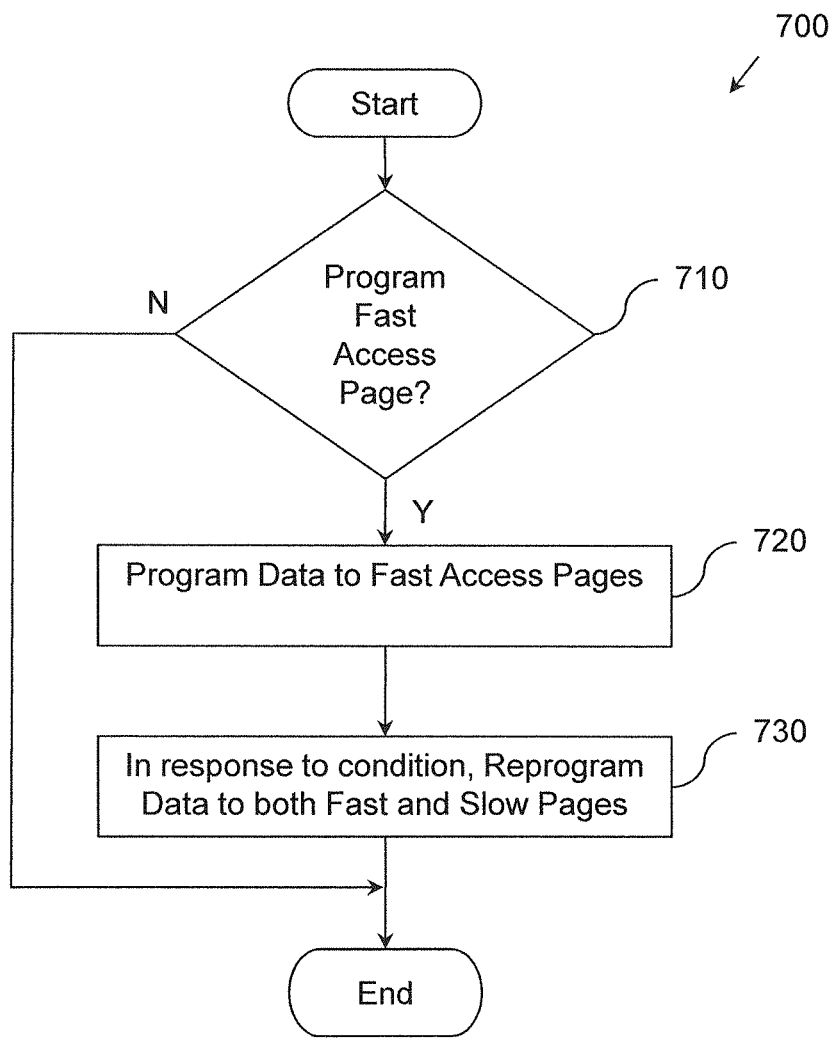
FIG. 7 illustrates another embodiment of a method associated with selectively accessing memory.

FIG. 7 illustrates another embodiment of a method 700 associated with controlling and selectively accessing memory. Method 700 improves the accessing of memory storage systems by allowing time critical memory applications to program fast access pages of memory instead of programming slow access pages of memory. For example, streaming video data will be written to the fast access pages so that no data is dropped when the streaming video data is received (e.g. the receiving and writing are concurrently performed).

The method 700 detects a request to program the data to the fast access pages at 710. Detecting the request may occur in a number of ways. For example, firmware receiving streaming video data may request the streaming video data be placed in fast access pages. Alternatively, a field value in the request may indicate that the data associated with the request is to be placed in fast access memory. Those of ordinary skilled in the art will appreciate other ways of detecting a request to program the data to the fast access pages. The data is programmed into the fast access pages at 720, as discussed above.

In another embodiment, the method 700 can also selectively reprogram the data in the memory so that both fast access pages and slow access pages of the flash memory are used under predetermined conditions (at 730). The reprogramming allows the memory to be more fully utilized. For example, copy/programming operations are performed to reprogram the data that is currently stored only in fast access pages to be stored in both fast and slow access pages, at 730. In one embodiment, this operation is triggered when there is no outstanding request to program data to the fast access pages. By waiting until there are no pending requests to access fast memory, time critical data is more likely to be received and not missed when the data arrives at the flash memory. The data in slow access memory may be processed when time permits. In another example, a semiconductor chip may be heating up when processing some computationally intensive instructions. The chip may be cooled down by accessing data to and from the slow access memory.

Figure 8:
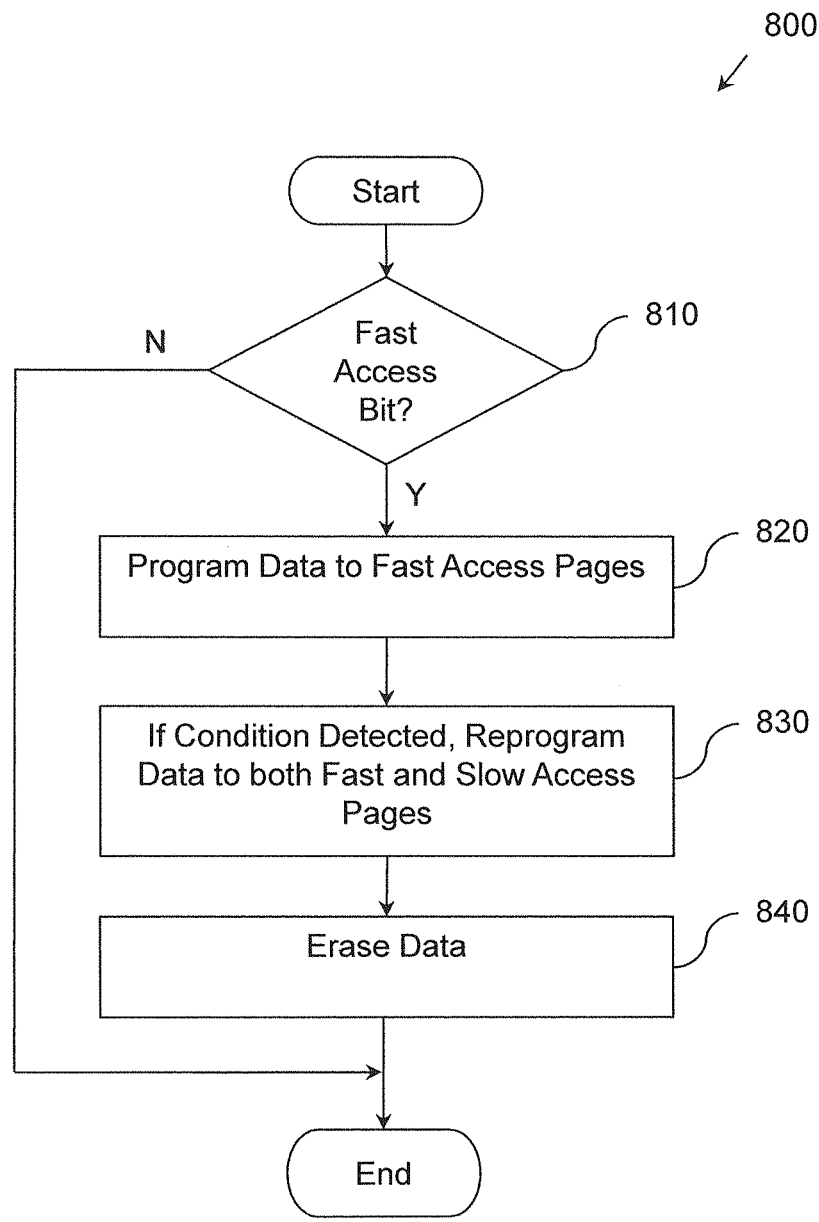
FIG. 8 illustrates another embodiment of a method associated with selectively accessing memory.

FIG. 8 illustrates another embodiment of a method 800 associated with controlling and selectively accessing memory. The method 800 improves accessing memory storage systems by allowing time critical memory applications to program fast access pages of memory instead of programming slow access pages of memory.

The method 800 detects a fast access bit at 810. The fast access bit is preconfigured to represent a request to program data to the fast access pages. The fast access bit may be part of a bit field of a memory request instruction. The request instruction is a request to access the fast access memory when the bit is high.

When the fast access bit is set, the data is programmed into the fast access pages at 820. The data may be programmed to fast access pages, at 820, as discussed above. When a predetermined condition is detected, the method 800 may selectively reprogram the data residing in the fast access pages to be in both the fast and slow access pages (at 830). In one embodiment, the predetermined condition may be when there is no outstanding request to program data to the fast access pages. At 840, data in the fast access pages may be erased from the fast access pages upon the data being transferred to the slow access pages if only slow access page are to be used. Erasing the data frees the fast access pages for subsequent use when the next condition is detected for using fast access pages.

It will be appreciated that, in the embodiments of FIGS. 7, 8, and/or others, the post processing operation of reprogramming the memory may include reprogramming some or all of the data in memory. As explained previously, if data is only stored in fast access pages, the data may be reprogrammed to both fast and slow pages. Thus the memory is more fully utilized.

Figure 9:
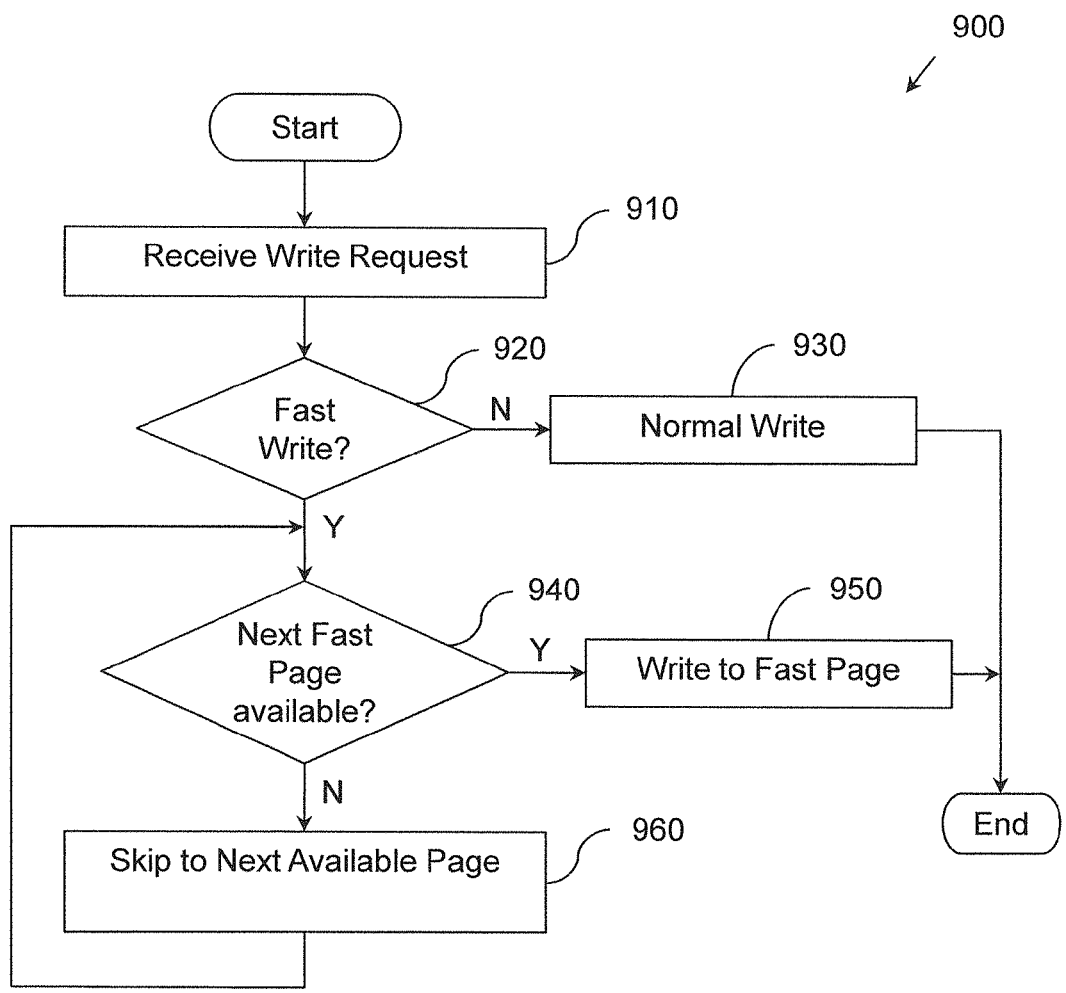
FIG. 9 illustrates another embodiment of a method associated with selectively accessing memory.

FIG. 9 illustrates another embodiment of a method 900 associated with controlling and selectively accessing memory. The method 900 improves the accessing of memory storage systems by allowing time critical memory applications to program fast access pages of memory instead of programming slow access pages of memory.

The method 900 begins by receiving a request to write a memory at 910. A determination is made at 920 to determine whether the request is to write a fast page of flash memory. If the request does not request a fast write to memory, then a normal write operation is performed at 930. The normal write may be a write to a slow page of memory. A write operation is one form of programming the flash memory.

If the write request is to write a fast page of memory, then the method 900 determines whether the next available page of memory is a fast page at 940. The method 900 performs the fast write to the fast page, at 950, when the next available page is a fast page of memory. The method skips to the next available page, at 960, when the next page of available memory is not a fast page.

It will be appreciated that in one embodiment, the methods herein may be implemented as computer executable instructions embodied and stored on a computer-readable medium. When executed by a machine (e.g., processor, device) the instructions cause the machine to perform the methods herein or their equivalents. In one embodiment, it will be appreciated that the methods described herein or their equivalents can be implemented in a chip or separate circuits.

Figure 10:
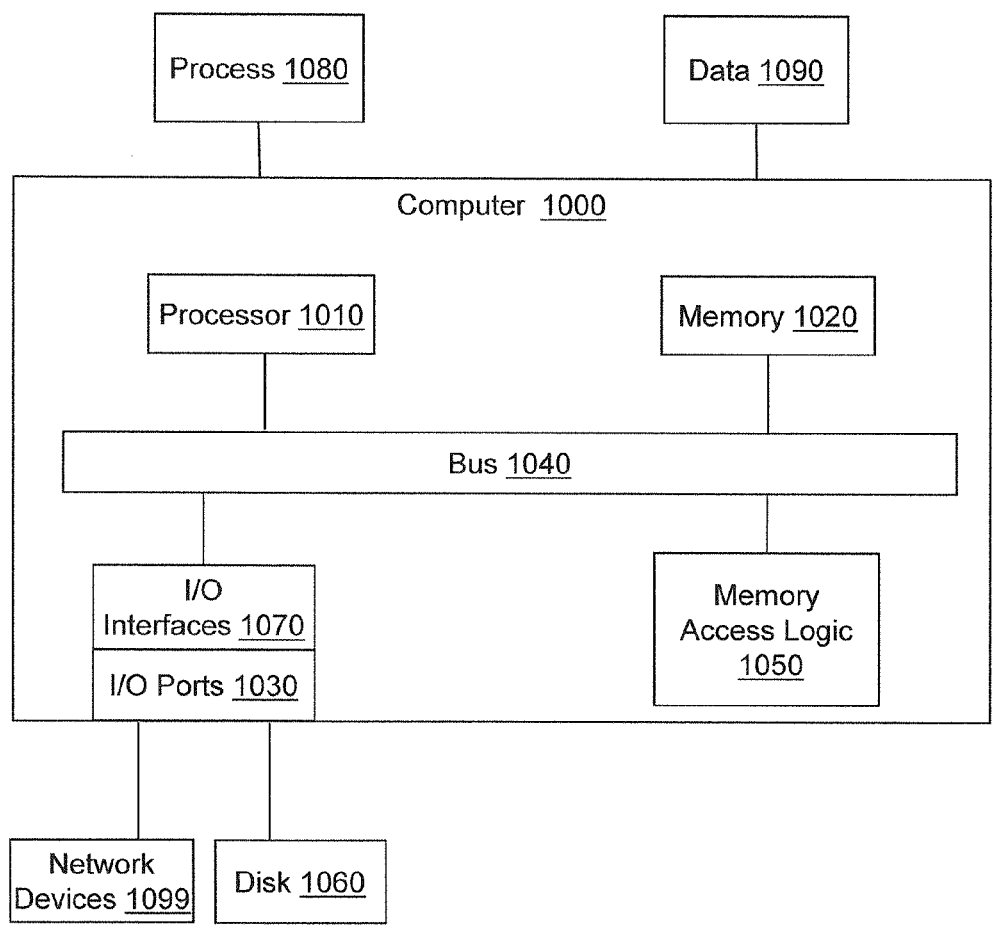
FIG. 10 illustrates an embodiment of a computing environment in which example systems and methods, and equivalents associated with selectively accessing memory may operate.

FIG. 10 illustrates an example computer 1000 in which example systems and methods described herein, and equivalents, are implemented. The example computer 1000 comprises a processor 1010, a memory 1020, and input/output ports 1030 operably connected by a bus 1040. In one example, the computer 1000 comprises memory access logic 1050 to selectively access memory.

The memory access logic 1050 provides means (e.g., structure of hardware, media with stored software, or firmware) to selectively access data in a flash memory, a solid state memory, memory 1020, or another memory. The memory access logic 1050 can be implemented similar to the apparatus 300 and 400, and/or combinations of their features. The memory access logic 1050 can include logic implemented, for example, as an ASIC or other type of circuit.

Generally describing an example configuration of the computer 1000, the processor 1010 may be a variety of various processors including dual microprocessor and other multi-processor architectures. A memory 1020 may include volatile memory and/or non-volatile memory. Non-volatile memory may include, for example, read-only memory (ROM), programmable read only memory (PROM), erasable programmable read only memory (EPROM), electronically erasable programmable read only memory (EEPROM), and so on. Volatile memory may include, for example, random access memory (RAM), static random access memory (SRAM), dynamic random access memory (DRAM), and so on.

A disk 1060 may be operably connected to the computer 1000 via, for example, through an input/output interface (e.g., card, device) 1070 and the input/output port 1030. The disk 1060 may be, for example, a magnetic disk drive, a solid state disk drive, a floppy disk drive, a tape drive, a Zip drive, a flash memory card, a memory stick, and so on. Furthermore, the disk 1060 may be a compact disk read-only memory (CD-ROM) drive, a compact disk recordable (CD-R) drive, a compact disk rewritable (CD-RW) drive, a digital video disk read-only memory (DVD ROM), and so on. The memory 1020 can store a process 1080 and/or a data 1090, for example. The disk 1060 and/or the memory 1020 can store an operating system that controls and allocates resources of the computer 1000.

The bus 1040 may be a single internal bus interconnect architecture and/or other bus or mesh architectures. While a single bus is illustrated, it is appreciated that the computer 1000 may communicate with various devices, logics, and peripherals using other busses (e.g., peripheral component interconnect express (PCIE), 1394, universal serial bus (USB), Ethernet). The bus 1040 can be types including, for example, a memory bus, a memory controller, a peripheral bus, an external bus, a crossbar switch, and/or a local bus.

The computer 1000 may interact with input/output devices via the input/output (I/O) interfaces 1070 including the memory access logic 1050 and the input/output ports 1030. Input/output devices may be, for example, a keyboard, a microphone, a pointing and selection device, cameras, video cards, displays, the disk 1060, the network devices 1099, and so on. The input/output ports 1030 may include, for example, serial ports, parallel ports, and USB ports.

The computer 1000 can operate in a network environment and thus may be connected to the network devices 1099 via the I/O interfaces 1070, and/or the I/O ports 1030. Through the network devices 1099, the computer 1000 may interact with a network. Through the network, the computer 1000 may be logically connected to remote computers. Networks with which the computer 1000 may interact include, but are not limited to, a local area network (LAN), a wide local area network (WLAN), a wide area network (WAN), and other networks.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

What is claimed is:

1. An apparatus configured to operate in a computing device, comprising:
    flash determination logic, implemented in at least hardware, to identify N access speeds available for accessing a multi-level memory cell device (MLMCD) comprising multi-level cells, wherein the multi-level cells are configured to store at least two bits per cell wherein most significant bits are grouped to define fast access pages and least significant bits are grouped to define slow access pages, wherein the fast access pages are accessed with less time and more power than the slow access pages; and
    flash control logic, implemented in at least hardware, to access the MLMCD upon receiving a memory command that is directed to a single type of memory, wherein the MLMCD is to be accessed using one speed of the N access speeds, where the one speed of the N access speeds is selected based on at least one parameter in the memory command;
    wherein flash control logic is further configured to detect a power indication signal received from a component in the computing device wherein the power indication signal, when asserted, indicates that less power is requested;
    wherein, in response to the power indication signal being asserted, the flash control logic is further configured to program data from a volatile memory to the slow access pages by programming the data into a group of least significant bits of the multi-level memory cell device while skipping the most significant bits to use less power.

2. The apparatus of claim 1, wherein the at least one parameter in the memory command is a bit that indicates an access speed for processing the memory command.

3. The apparatus of claim 1, wherein the N access speeds are based on MLMCD access types.

4. The apparatus of claim 1, wherein the multi-level cells are two level cells, triple level cells, or quad level cells.

5. The apparatus of claim 1, wherein the N access speeds are comprised of a slow group of access speeds and a fast group of access speeds, wherein the slow group accesses the MLMCD slower than the fast group, and wherein the flash control logic is configured to access the MLMCD with the slow group of access speeds when the flash control logic receives the power indication signal from an application software.

6. A method for controlling a multi-level memory cell device in a computing device wherein the computing device includes at least a volatile memory, the method comprising:
    identifying N access speeds available for accessing the multi-level memory cell device (MLMCD) that comprises multi-level cells, wherein the multi-level cells are configured to store at least two bits per cell wherein most significant bits are grouped to define fast access pages and least significant bits are grouped to define slow access pages, wherein the fast access pages are accessed with less time and more power than the slow access pages;
    accessing the MLMCD upon receiving a memory command that is directed to the MLMCD, wherein the MLMCD is accessed using one speed of the N access speeds identified, where the one speed of the N access speeds is selected based on at least one parameter in the memory command;
    detecting a power indication signal received from a component in the computing device wherein the power indication signal, when asserted, indicates that less power is requested; and
    in response to the power indication signal being asserted, programming data from the volatile memory to the slow access pages by programming the data into a group of least significant bits of the multi-level memory cell device while skipping the most significant bits to use less power.

7. The method of claim 6, wherein the at least one parameter in the memory command is a bit that indicates an access speed for processing the memory command, wherein the method includes reading the bit from the memory command.

8. The method of claim 6, wherein the N access speeds are identified based on MLMCD access types.

9. The method of claim 6, wherein accessing the MLMCD includes accessing two level cells, triple level cells, or quad level cells.

10. The apparatus of claim 6, wherein the N access speeds are comprised of a slow group of access speeds and a fast group of access speeds, wherein the slow group accesses the MLMCD slower than the fast group, and wherein method includes accessing the MLMCD with the slow group of access speeds when the power indication signal is received from an application software executing on the computing device.

11. A computing device, comprising:
a volatile memory;
a multi-level memory cell device (MLMCD) comprising multi-level cells, wherein the multi-level cells are configured to store at least two bits per cell wherein most significant bits are grouped to define fast access pages and least significant bits are grouped to define slow access pages, wherein the fast access pages are accessed with less time and more power than the slow access pages;
a memory controller implemented in a chip that is operatively connected to the volatile memory and the multi-level memory cell device, the memory controller comprising:
flash determination logic, implemented in at least hardware in the chip, to identify N access speeds available for accessing a multi-level memory cell device (MLMCD) comprising multi-level cells, wherein the multi-level cells are configured to store at least two bits per cell wherein most significant bits are grouped to define fast access pages and least significant bits are grouped to define slow access pages, wherein the fast access pages are accessed with less time and more power than the slow access pages; and
flash control logic, implemented in at least the hardware in the chip, to access the MLMCD upon receiving a memory command that is directed to a single type of memory, wherein the MLMCD is to be accessed using one speed of the N access speeds, where the one speed of the N access speeds is selected based on at least one parameter in the memory command;
wherein flash control logic is further configured to detect a power indication signal received from a component in the computing device wherein the power indication signal, when asserted, indicates that less power is requested;
wherein, in response to the power indication signal being asserted, the flash control logic is further configured to program data from the volatile memory to the slow access pages of the MLMCD by programming the data into a group of least significant bits of the multi-level memory cell device while skipping the most significant bits to use less power.

12. The computing device of claim 11, wherein the at least one parameter in the memory command is a bit that indicates an access speed for processing the memory command.

13. The computing device of claim 11, wherein the N access speeds are based on MLMCD access types.

14. The computing device of claim 11, wherein the multi-level cells are two level cells, triple level cells, or quad level cells.

15. The computing device of claim 11, wherein the N access speeds are comprised of a slow group of access speeds and a fast group of access speeds, wherein the slow group accesses the MLMCD slower than the fast group, and wherein the flash control logic is configured to access the MLMCD with the slow group of access speeds when the flash control logic receives the power indication signal from an application software.

* * * * *